United States Patent
Takai et al.

(10) Patent No.: US 11,600,950 B2
(45) Date of Patent: Mar. 7, 2023

(54) HIGH-SPEED SIGNAL CONNECTOR AND RECEPTACLE ASSEMBLY EQUIPPED THEREWITH AND TRANSCEIVER MODULE ASSEMBLY EQUIPPED THEREWITH

(71) Applicant: YAMAICHI ELECTRONICS CO., LTD., Tokyo (JP)

(72) Inventors: Yosuke Takai, Tokyo (JP); Toshiyasu Ito, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 0 days.

(21) Appl. No.: 16/772,126

(22) PCT Filed: Dec. 14, 2017

(86) PCT No.: PCT/JP2017/044956
§ 371 (c)(1),
(2) Date: Jun. 11, 2020

(87) PCT Pub. No.: WO2019/116516
PCT Pub. Date: Jun. 20, 2019

(65) Prior Publication Data
US 2021/0075163 A1    Mar. 11, 2021

(51) Int. Cl.
*H01R 9/00* (2006.01)
*H01R 13/6461* (2011.01)
(Continued)

(52) U.S. Cl.
CPC ....... *H01R 13/6461* (2013.01); *G02B 6/4278* (2013.01); *H01R 12/73* (2013.01);
(Continued)

(58) Field of Classification Search
CPC .... H01R 13/6461; H01R 12/73; H01R 12/57; G02B 6/4278; H05K 1/111
See application file for complete search history.

(56) References Cited

U.S. PATENT DOCUMENTS 5,162,002 A * 11/1992 Regnier ............... H01R 12/721
439/157
6,644,995 B1 * 11/2003 Jones .................. H01R 13/4362
439/267
(Continued)

FOREIGN PATENT DOCUMENTS

JP    H05-217642 A    8/1993
JP    2002334755 A    11/2002
(Continued)

OTHER PUBLICATIONS

An Office Action; "Notice of Reasons for Refusal", mailed by the Japanese Patent Office dated Mar. 2, 2021, which corresponds to Japanese Patent Application No. 2019-559507 and is related to U.S. Appl. No. 16/772,126; with English language translation.
(Continued)

*Primary Examiner* — Neil Abrams
(74) *Attorney, Agent, or Firm* — Studebaker & Brackett PC

(57) ABSTRACT

A group of contact pads (20EB) formed on a lower surface (20B) at a connection end of a board portion of an optical module board (20) includes, in order from the endmost end, a contact pad (20B1) conducting to a ground line (G), contact pads (20B2) and (20B3) conducting to transmission-side high-speed signal lines (S), a contact pad (20B4) conducting to the ground line (G), contact pads (20B5, 20B6, and 20B7) conducting to low-speed signal lines (S), a contact pad (20B8) conducting to the ground line (G), contact pads (20B9 and 20B10) conducting to receiving-side high-speed signal lines (S), and a contact pad (20B11) conducting to the ground line (G). Fixed terminal portions of a plurality of contact terminals (32ai) connected to the contact pads (20B2 and 20B3) conducting to the transmission-side high-speed signal lines (S) and the contact pads (20B9 and 20B10) conducting to the receiving-side high- (Continued)

speed signal lines (S) in a host connector (30) are electrically connected to conductive paths (16THL, 16RHL), which are continuous with high-speed signal lines formed on a plane shared with electrode portions (16BE2, 16BE3, 16BE9, and 16BE10) via the electrode portions (16BE2, 16BE3, 16BE9, and 16BE10) of a printed wiring board (16).

9 Claims, 12 Drawing Sheets

(51) Int. Cl.
   *G02B 6/42*    (2006.01)
   *H01R 12/73*   (2011.01)
   *H05K 1/02*    (2006.01)
   *H05K 1/11*    (2006.01)
   *H01R 12/57*   (2011.01)

(52) U.S. Cl.
   CPC .......... *H05K 1/0219* (2013.01); *H05K 1/111* (2013.01); *H01R 12/57* (2013.01); *H05K 1/117* (2013.01)

(56) References Cited

U.S. PATENT DOCUMENTS

| | | | |
|---|---|---|---|
| 7,044,752 B2* | 5/2006 | Olson | H01R 13/422 439/79 |
| 7,204,648 B2* | 4/2007 | Aronson | H05K 1/0216 385/92 |
| 7,387,517 B2 | 6/2008 | Kusuda et al. | |
| 7,446,261 B2* | 11/2008 | Kumar | H05K 1/118 174/254 |
| 7,453,338 B2* | 11/2008 | Aronson | H05K 1/0216 333/260 |
| 7,585,188 B2* | 9/2009 | Regnier | H01R 12/721 439/637 |
| 7,833,068 B2* | 11/2010 | Bright | H01R 13/502 439/733.1 |
| 7,901,226 B2* | 3/2011 | Kotaka | H01R 13/658 439/160 |
| 8,267,718 B2* | 9/2012 | Straka | H01R 13/6593 439/497 |
| 8,328,565 B2* | 12/2012 | Westman | H01R 13/6471 439/682 |
| 8,371,861 B1* | 2/2013 | Cina | H01R 13/6461 439/62 |
| 8,545,240 B2* | 10/2013 | Casher | H01R 13/6474 439/108 |
| 8,721,193 B2* | 5/2014 | Amirkiai | G02B 6/4278 385/92 |
| 8,727,793 B2* | 5/2014 | Cafiero | G02B 6/4201 439/76.1 |
| 8,764,488 B2* | 7/2014 | Zeng | H01R 13/6585 439/108 |
| 8,858,237 B2* | 10/2014 | Hsu | H01R 13/514 439/60 |
| 8,926,377 B2* | 1/2015 | Kirk | H01R 12/724 439/701 |
| 9,306,334 B2* | 4/2016 | Zhu | H01R 13/6471 |
| 9,614,333 B2* | 4/2017 | Tsai | H01R 24/70 |
| 9,692,183 B2* | 6/2017 | Phillips | H01R 13/6471 |
| 10,101,537 B2* | 10/2018 | Nelson | H01R 13/6471 |
| 10,129,983 B2* | 11/2018 | Uchida | H05K 1/147 |
| 2007/0232091 A1 | 10/2007 | Hong | |
| 2011/0189895 A1 | 8/2011 | Ito et al. | |
| 2012/0225583 A1* | 9/2012 | Kamarauskas | H01R 13/41 439/607.01 |
| 2012/0315796 A1 | 12/2012 | Pang et al. | |
| 2013/0017733 A1 | 1/2013 | Kirk et al. | |
| 2015/0270645 A1 | 9/2015 | Sato et al. | |
| 2017/0179627 A1 | 6/2017 | Nelson | |

FOREIGN PATENT DOCUMENTS

| | | |
|---|---|---|
| JP | 3928075 B2 | 6/2007 |
| JP | 2007141587 A | 6/2007 |
| JP | 2011-159465 A | 8/2011 |
| JP | 4776483 B2 | 9/2011 |
| JP | 2013004518 A | 1/2013 |
| JP | 5298227 B1 | 9/2013 |
| JP | 5405582 B2 | 2/2014 |
| JP | 2015115148 A | 6/2015 |
| JP | 2015179569 A | 10/2015 |
| JP | 2016225242 A | 12/2016 |

OTHER PUBLICATIONS

International Search Report issued in PCT/JP2017/044956; dated Feb. 6, 2018.
International Preliminary Report on Patentability and Written Opinion issued in PCT/JP2017/044956; dated Jun. 16, 2020.
An Office Action; "Notice of Reasons for Refusal", mailed by the Japanese Patent Office dated Sep. 7, 2021, which corresponds to Japanese Patent Application No. 2019-559507 and is related to U.S. Appl. No. 16/772,126; with English language translation.
An Office Action mailed by the Japanese Patent Office dated Apr. 5, 2022, which corresponds to Japanese Patent Application No. 2019-559507 and is related to U.S. Appl. No. 16/772,126.

\* cited by examiner

HIGH-SPEED SIGNAL CONNECTOR AND RECEPTACLE ASSEMBLY EQUIPPED THEREWITH AND TRANSCEIVER MODULE ASSEMBLY EQUIPPED THEREWITH

TECHNICAL FIELD

The present invention relates to a high-speed signal connector, and a receptacle assembly equipped therewith and a transceiver module assembly equipped therewith.

BACKGROUND ART

A transceiver module and a receptacle assembly have been in practical use in an optical communication system in order for an optical signal transmitted by using an optical fiber or a copper cable, an optical connector, and the like to be transferred to a mother board. As disclosed in PATENT DOCUMENT 1, for example, a transceiver module (which is referred to as an SFP module in PATENT DOCUMENT 1) is made attachable to and detachable from a cage that constitutes part of a receptacle assembly placed on a printed wiring board. For instance, such transceiver module comprises, as its main elements: a transmitting optical sub-assembly (hereinafter also referred to as a TOSA); a receiving optical sub-assembly (hereinafter also referred to as an ROSA); a module board configured to perform signal processing, control, and the like for the TOSA and the ROSA; and a connection terminal portion of the module board configured to electrically connect the module board to a host connector in a receptacle assembly. As disclosed in PATENT DOCUMENT 2, for example, the connection terminal portion of the module board is electrically connected to a mother board through an SFP (small form-factor pluggable) connector serving as the aforementioned host connector. The SFP connector has a slot located at an end of a housing and opened toward an opening end portion of a cage that allows the transceiver module to pass through. The connection terminal portion of the module board is detachably inserted into the housing through the slot. A first contact terminal array and a second contact terminal array, in which respective contact portions are arranged opposite to one another in such a way as to pinch the connection terminal portion of the module board, are provided in the housing of the SFP connector. In each of the first contact terminal array and the second contact terminal array, contact terminals are arranged at predetermined intervals in such a way as to be substantially orthogonal to a direction of attachment and detachment of the connection terminal portion of the module board. Each of the first contact terminal array and the second contact terminal array comprises 10 pieces of contact terminals, for instance. Hereby, the contact portions in the first contact terminal array and the second contact terminal array are electrically connected to an upper contact pad array and a lower contact pad array of the connection terminal portion of the inserted module board, respectively.

PRIOR ART DOCUMENT

Patent Document

PATENT DOCUMENT 1: Japanese Patent No. 4,776,483
PATENT DOCUMENT 2: Japanese Patent No. 5,405,582

SUMMARY OF INVENTION

In recent years, developments have been in progress so as to realize a transceiver module and a receptacle assembly that are adaptable to a data transmission speed of 25 Gbs or above in an optical communication system.

However, the SFP connector aligned with the conventional standard as mentioned above has a limitation in obtaining high-speed signal characteristics adaptable to the data transmission speed (a communication speed) of 25 Gbs or above, and also has a limitation in increasing the number of signal channels in a high-frequency band. At that time, it is to be desired that the transceiver module and the receptacle assembly adaptable to the data transmission speed of 25 Gbs or above are also connectable to an optical fiber or a copper cable, an optical connector, and the like aligned with the 10-Gbs standard in order to additionally establish connection to the optical fiber or the copper cable, the optical connector, and the like aligned with the 10-Gbs standard in the old-style communication system during a transitional period from the transceiver module aligned with the 10-Gbs standard to the transceiver module aligned with the 25-Gbs standard.

In view of the above-described problem, the present invention aims to provide a high-speed signal connector, a receptacle assembly equipped therewith, and a transceiver module assembly equipped therewith. The high-speed signal connector, the receptacle assembly equipped therewith, and the transceiver module assembly equipped therewith can handle transmission of signals in a relatively high-frequency band and increase the number of channels for high-frequency band signals, and can additionally establish connection to a transceiver module aligned with a different standard for a high-frequency band.

To achieve the above-described object, a high-speed signal connector according to the present invention comprises a housing that includes a connection end accommodating portion. The connection end accommodating portion has a first group of contact terminals connected to one electrode surface at a connection end of an optical module board; and a second group of contact terminals connected to the other electrode surface facing the one electrode surface at the connection end of the optical module board, wherein the first group of contact terminals includes, on both sides of an array of a plurality of contact terminals conducting to a group of low-speed control signal lines, a pair of contact terminals conducting to a pair of transmission-side high-speed signal lines adjacent to each other via a grounding contact terminal, a pair of contact terminals conducting to a pair of receiving-side high-speed signal lines adjacent to each other via a grounding contact terminal, and grounding contact terminals.

In addition, the adjacent plurality of grounding contact terminals constituting part of the first group of contact terminals may be connected therebetween by a plurality of connection members at electrically identical potential. The first group of contact terminals and the second group of contact terminals may comprise 11-piece contact terminals respectively.

Moreover, in a case where fixed terminal portions of the contact terminals constituting the first group of contact terminals are formed by being folded in an insertion direction of the connection end of the optical module board with respect to the connection end accommodating portion of the housing, the fixed terminal portions of at least one of the pairs of contact terminals may be connected directly to an end of a conductive path for high-speed signals formed so as to be adjacent to a conductive path to which the second group of contact terminals is electrically connected to a wiring board to which the housing is fixed. In addition, the end of the optical module board may be connected to a plug connector.

The position of another end of a movable contact portion of each of the contact terminals constituting the first group of contact terminals with respect to a mounting surface of a wiring board to which the housing is fixed may be away from the mounting surface as compared with the position of an end of an inclined surface portion of a fixed portion of each of the contact terminals constituting the second group of contact terminals with respect to the mounting surface of the wiring board to which the housing is fixed.

A receptacle assembly according to the present invention includes: the above-described high-speed signal connector to be connected to a transceiver module including the optical module board; and a receptacle cage including a module accommodating portion having a module slot provided at one end and configured to allow passage of the transceiver module, the module accommodating portion for attachably and detachably accommodating the transceiver module, and a connector accommodating portion communicating with the module accommodating portion and accommodating the high-speed signal connector.

A transceiver module assembly according to the present invention comprises: a transceiver module including an optical module board which has a pair of transmission-side high-speed signal lines adjacent to each other via a grounding line, a pair of receiving-side high-speed signal lines adjacent to each other via a grounding line, and grounding lines on both sides of a group of low-speed control signal lines on one electrode surface; and a receptacle assembly including a high-speed signal connector connected to the transceiver module, and a receptacle cage having a module accommodating portion including a module slot provided at one end and configured to allow passage of the transceiver module, the module accommodating portion for attachably and detachably accommodating the transceiver module, and a connector accommodating portion communicating with the module accommodating portion and accommodating the high-speed signal connector.

A transceiver module according to the present invention comprises: an optical module board being connected to an optical connector and including, on one electrode surface, a pair of transmission-side high-speed signal lines adjacent to each other via a grounding line, a pair of receiving-side high-speed signal lines adjacent to each other via a grounding line, and grounding lines on both sides of a group of low-speed control signal lines; an upper case covering the upper portion of the optical module board; and a lower case covering the lower portion of the optical module board.

According to the high-speed signal connector as well as the receptacle assembly equipped therewith and the transceiver module assembly equipped therewith, the first group of contact terminals includes, on both sides of the array of the contact terminals conducting to the group of low-speed control signal lines, the pair of contact terminals conducting to the pair of transmission-side high-speed signal lines adjacent to each other via the grounding contact terminal, the pair of contact terminals conducting to the pair of receiving-side high-speed signal lines adjacent to each other via the grounding contact terminal, and the grounding contact terminals. Therefore, it is possible to handle transmission of signals in a relatively high-frequency band, to increase the number of channels for high-frequency band signals, and moreover, to establish connection to a transceiver module according to a different standard for a high-frequency band.

DESCRIPTION OF EMBODIMENTS

Figure 2:
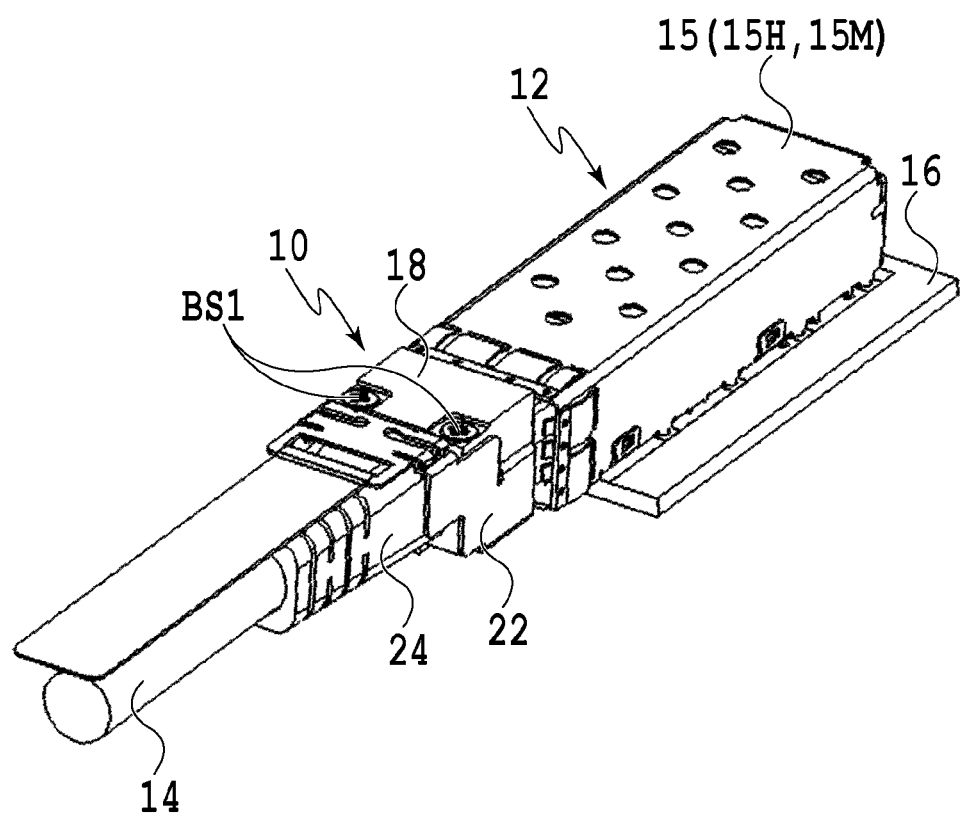
FIG. 2 is a perspective view showing appearance of an example of a transceiver module assembly and an example of a receptacle assembly according to the present invention together with a printed wiring board.

FIG. 2 shows an example of a transceiver module assembly and an example of a receptacle assembly according to the present invention together with a printed wiring board.

Figure 3:
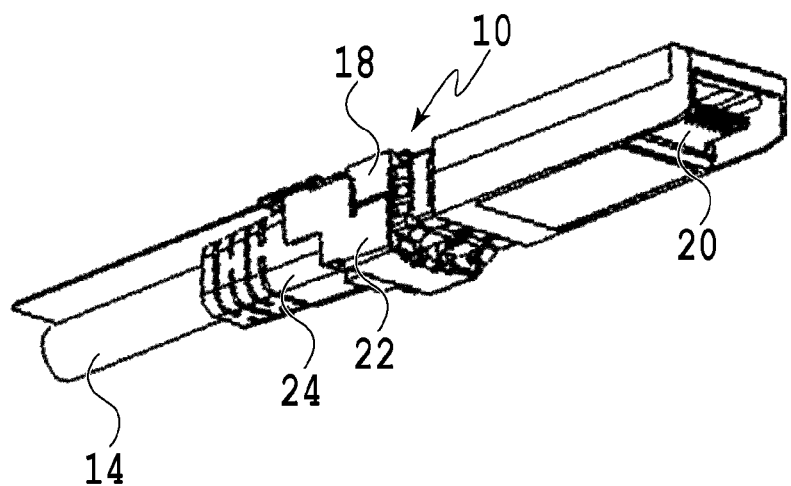
FIG. 3 is a perspective view showing an example of the transceiver module according to the present invention.

In FIGS. 2 and 3, a transceiver module assembly comprises, as its main elements: a transceiver module (hereinafter also referred to as an optical module) 10 to which an optical connector 24 connected to one end of an optical fiber cable 14 as an optical cable is attachably and detachably connected; and an optical module receptacle assembly 12 to which the optical module 10 is connected.

The optical module 10 is adaptable to a communication speed of 56 Gbs or above, for example, and comprises an optical module board 20 (see FIG. 4), an upper case 18 that covers an upper part of the optical module board 20, and a lower case 22 that covers a lower part of the optical module board 20.

The upper case 18 is formed from a metal material having excellent heat conductivity, for example, and has a recess (not shown) to accommodate the upper part of the optical module board 20. Through holes (not shown) communicating with the recess are formed at two positions with a predetermined interval in an upper wall portion that forms the recess. Machine screws BS1 for fixing the upper case 18 to the optical module board 20 and to the lower case 22 to be described later are inserted into the respective through holes. The lower case 22 is formed from a metal material having excellent heat conductivity, for example, and has a relatively shallow recess (not shown) to accommodate the lower part of the optical module board 20.

The optical module board 20 comprises, as its main elements: a connector supporting member (not shown) configured to accommodate and support a receptacle (not shown) to which the optical connector 24 is connected; and a board portion configured to support the connector supporting member and provided with a mounting surface on which mount light-emitting/light-receiving element units and the like are mounted.

Figure 1B:
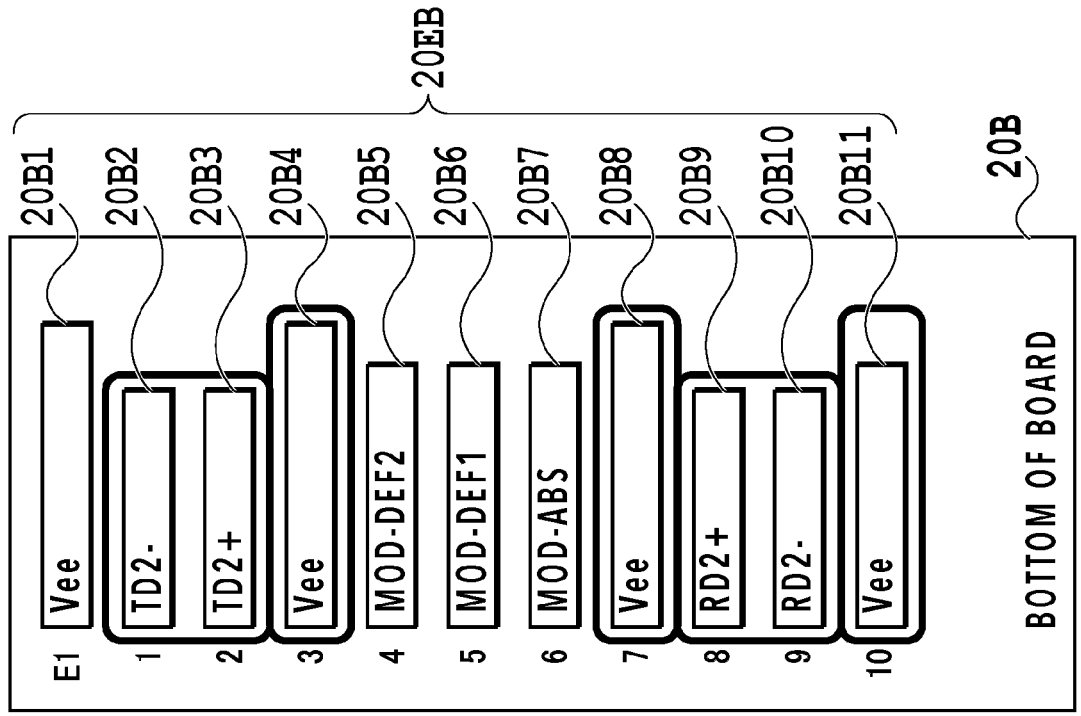
FIG. 1B is a diagram showing an arrangement of a group of contact pads at a connection end on a lower surface opposed to the connection end on the upper surface of the optical module board illustrated in FIG. 1A.
Figure 1A:
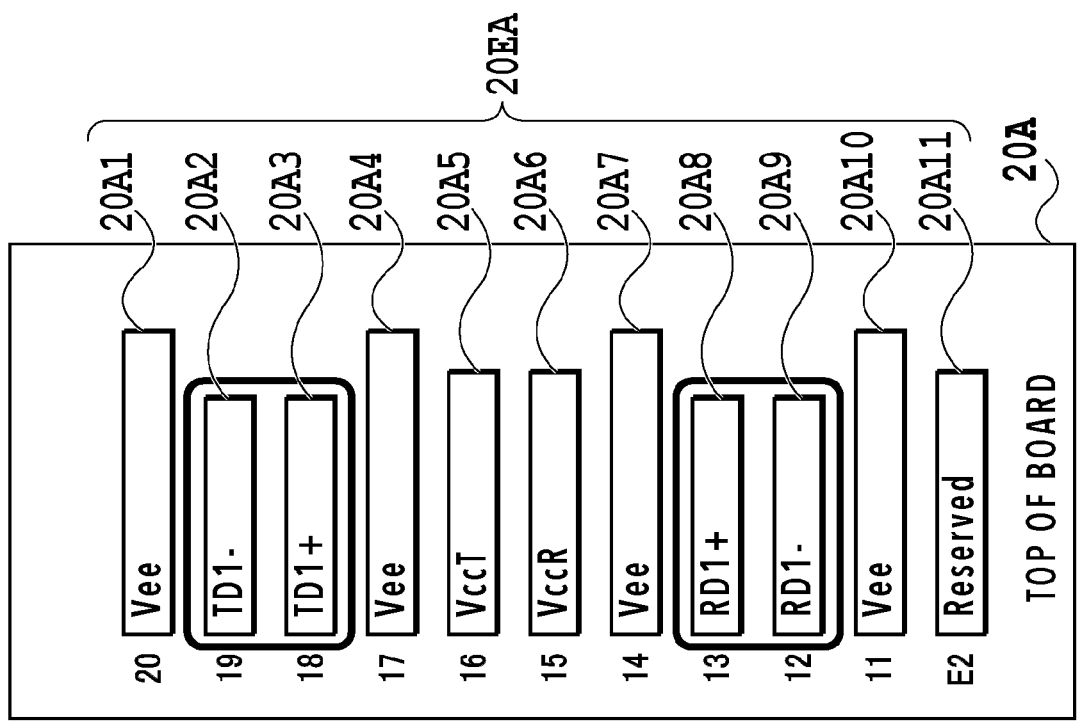
FIG. 1A is a diagram showing an arrangement of a group of contact pads at a connection end on an upper surface of an optical module board to be connected to an example of a high-speed signal connector according to the present invention.
Figure 5:
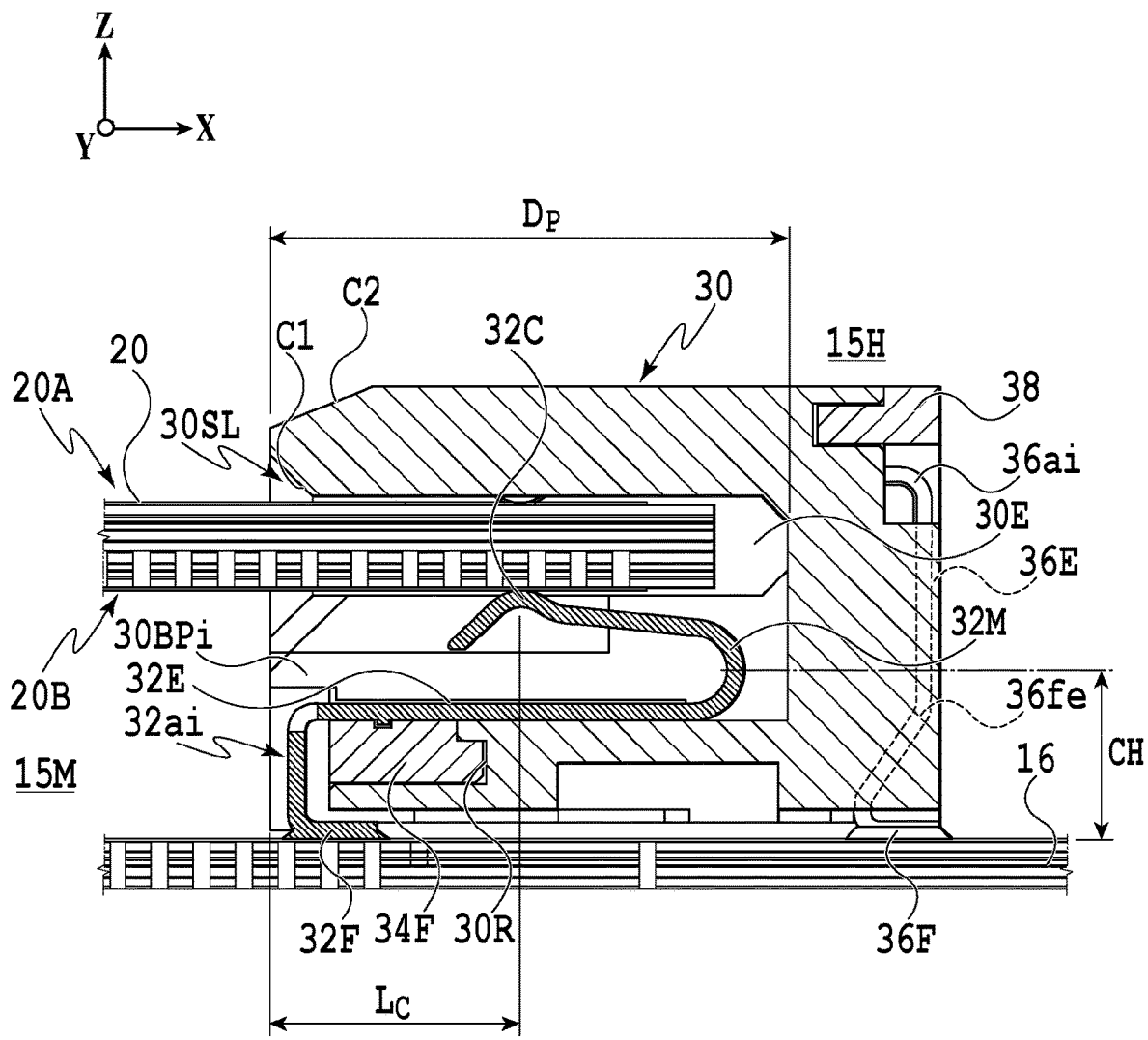
FIG. 5 is a cross-sectional view taken along the V-V line in FIG. 4.

As shown in the exaggeratedly enlarged view of FIGS. 1A and 1B, a connection end of the board portion has groups of contact pads 20EA and 20EB each formed from a plurality of contact pads having a thickness of about 1 mm and being formed parallel to one another at predetermined intervals, which are formed on an upper surface 20A and a lower surface 20B at one end (see FIG. 5). In addition, the groups of contact pads 20EA and 20EB are electrically connected to conductive patterns in the board portion. A connection end of the board portion is electrically connected to an end provided with the above-described connector supporting member through conductors formed inside.

As shown in FIG. 1A, for example, the group of contact pads 20EA formed on the upper surface 20A at the connection end of the board portion comprises, in order from the endmost end, a contact pad 20A1 conducting to a ground line (G), contact pads 20A2 and 20A3 conducting to transmission-side high-speed signal lines (S), a contact pad 20A4 conducting to the ground line (G), power supply contact pads 20A5 and 20A6 conducting to a power supply line, a contact pad 20A7 conducting to the ground line (G), contact pads 20A8 and 20A9 conducting to receiving-side high-speed signal lines (S), a contact pad 20A10 conducting to the ground line (G), and a reserved contact pad 20A11. In other words, the group of contact pads 20EA comprises 11-piece contact pads.

As shown in FIG. 1B, for example, the group of contact pads 20EB formed on the lower surface 20B at the connection end of the board portion comprises, in order from the endmost end, a contact pad 20B1 conducting to the ground line (G), contact pads 20B2 and 20B3 conducting to the transmission-side high-speed signal lines (S), a contact pad 20B4 conducting to the ground line (G), contact pads 20B5, 20B6, and 20B7 conducting to low-speed signal lines (S), a contact pad 20B8 conducting to the ground line (G), contact pads 20B9 and 20B10 conducting to the receiving-side high-speed signal lines (S), and a contact pad 20B11 conducting to the ground line (G). In other words, the group of contact pads 20EB comprises 11-piece contact pads. The group of contact pads 20EB is offset with respect to the above-described group of contact pads 20EA along a direction of arrangement of the contact pads.

The optical module receptacle assembly 12 is fixed onto a printed wiring board 16 in a given electronic device, for example. The optical module receptacle assembly 12 comprises a receptacle cage 15 that forms a contour portion of the optical module receptacle assembly 12, and a host connector 30 (see FIGS. 4 to 6) placed in a host connector accommodating portion 15H formed in the receptacle cage 15.

The receptacle cage 15 is formed from a metal material, for example, and has the host connector accommodating portion 15H inside.

The host connector accommodating portion 15H communicates with a module insertion slot located on one end side of the receptacle cage 15. A space (a module accommodating portion 15M) that allows insertion of a connection end of the optical module 10 is defined between one end of the host connector 30 and an end of a plug insertion slot inside the host connector accommodating portion 15H.

Figure 7:
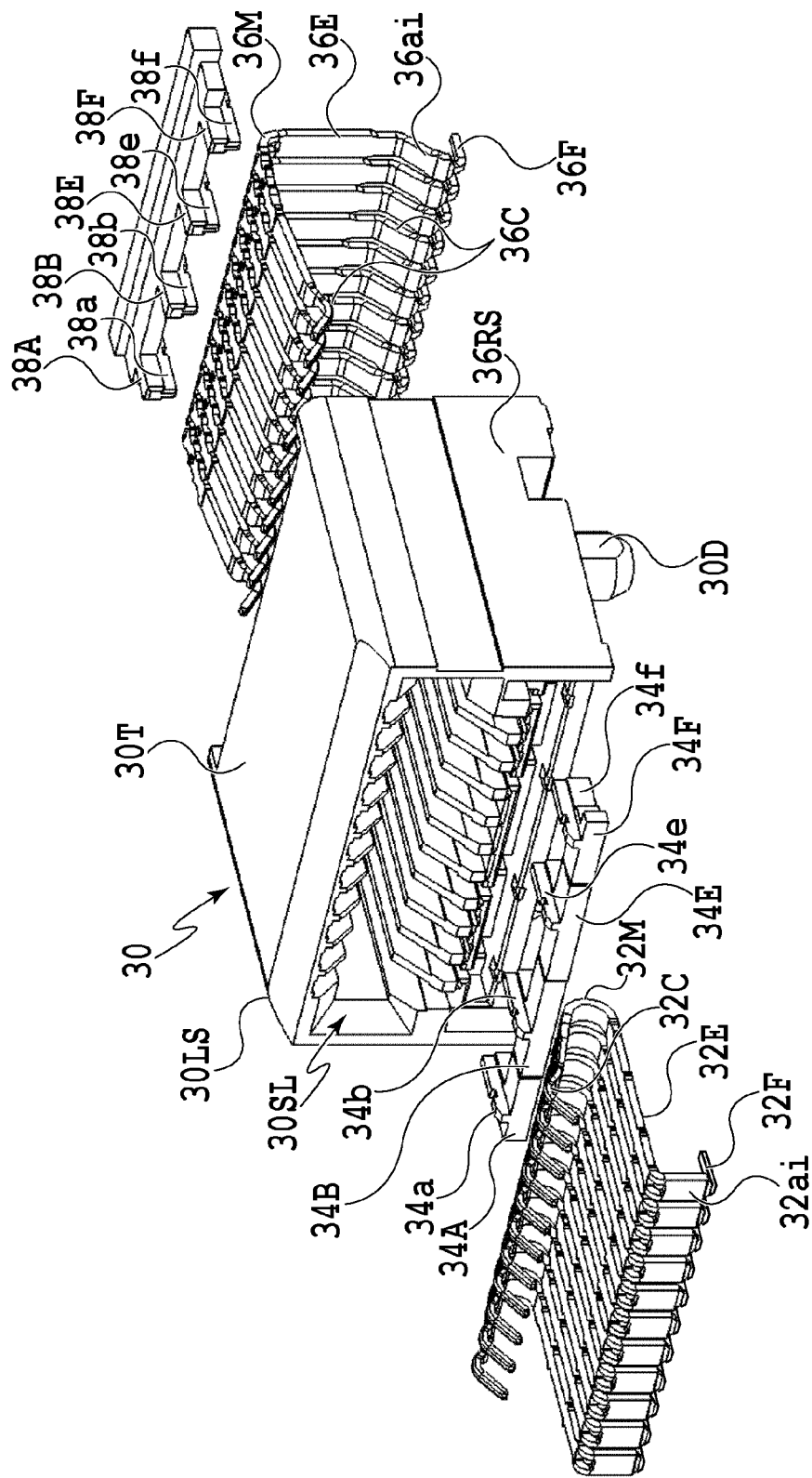
FIG. 7 is an exploded perspective view showing an exploded configuration of the high-speed signal connector illustrated in FIG. 6.

The host connector 30 is made adaptable to a communication speed of 56 Gbs or above, for example, and comprises a connector insulator provided with a slot 30SL that allows attachable and detachable insertion of the connection end of the optical module 10, and a plurality of contact terminals 32$ai$ and 36$ai$ ($i$=1 to n where n is a positive integer) (see FIGS. 5 and 7).

The respective contact terminals 32$ai$ and 36$ai$ are configured to establish electrical connection of the connection end of the optical module 10 to a group of electrodes to be connected to conductive patterns on the printed wiring board 16 to be described later.

As shown in FIGS. 5 and 7, each contact terminal 32$ai$ comprises a movable contact portion 32M having a contact portion 32C provided at one end and brought into contact with one of the contact pads 20B1 to 20B11 of the connection end of the optical module 10, a fixed portion 32F having a fixed terminal portion provided at one end and fixed by soldering to the group of electrodes of the printed wiring board 16, and a coupling portion 32E configured to couple another end of the movable contact portion 32M to another end of the fixed portion 32F. As shown in the enlarged view of FIG. 5, the fixed terminal portion of the fixed portion 32F is bent toward a direction of insertion of the connection end of the optical module 10 along an X-coordinate axis direction in such a way as to be substantially parallel to the coupling portion 32E. At that time, a distance CH from the other end (a curved portion) of the movable contact portion 32M to the mounting surface of the printed wiring board 16 is set larger than a distance from an end 36*fe* of an inclined surface portion of a fixed portion 36F of the corresponding contact terminal 36$ai$ to be described later to the mounting surface of the printed wiring board 16. Hereby, because the movable contact portion 32M and a movable contact portion 36M of the contact terminal 36$ai$ are located more remote from each other, whereby a crosstalk characteristic of the host connector 30 is improved.

Note that in FIG. 5, a Y-coordinate axis is in line with a direction of arrangement of the contact terminals 32$ai$ and 36$ai$ while the X-coordinate axis is in line with a direction of attachment and detachment of the connection end of the optical module 10. A Z-coordinate axis is orthogonal to the X-coordinate axis and the Y-coordinate axis.

Each contact terminal 36$ai$ comprises the movable contact portion 36M having a contact portion 36C provided at one end and brought into contact with one of the contact pads 20A1 to 20A11 of the connection end of the optical module 10, the fixed portion 36F having a fixed terminal portion provided at one end and fixed by soldering to the group of electrodes of the printed wiring board 16, and a coupling portion 36E configured to couple another end of the movable contact portion 36M to another end of the fixed portion 36F. As shown in the enlarged view of FIG. 7, the fixed terminal portion of the fixed portion 36F is bent toward the direction of insertion of the connection end of the optical module 10 in such a way as to be substantially orthogonal to the coupling portion 36E.

Figure 6:
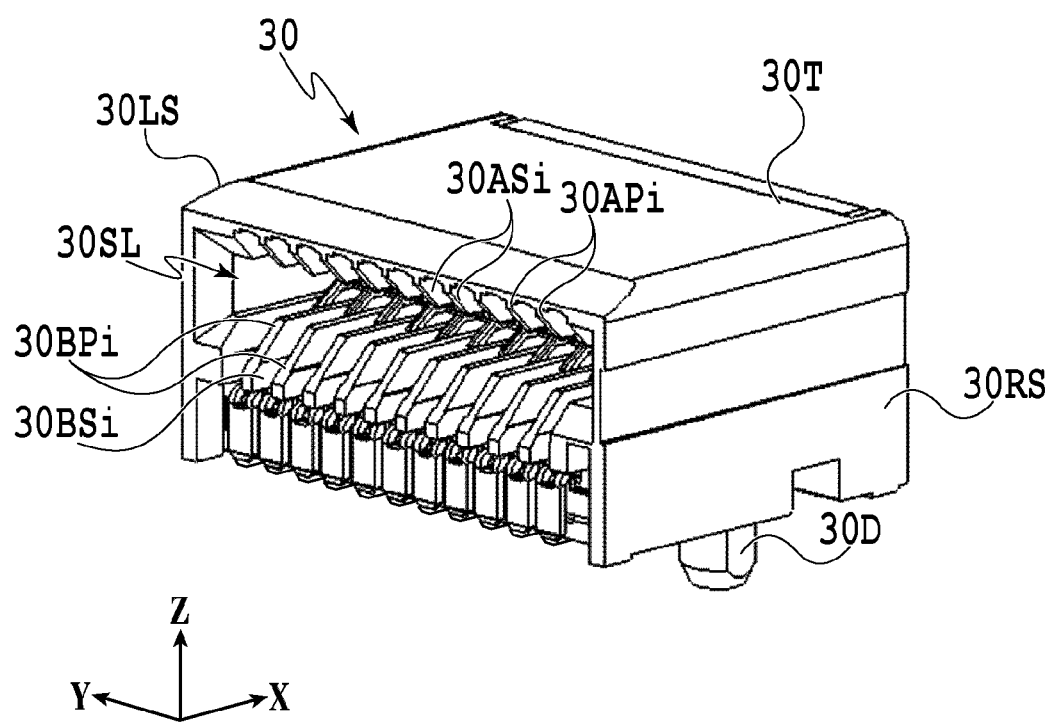
FIG. 6 is a perspective view showing appearance of the example of the high-speed signal connector according to the present invention.

As shown in FIG. 6, the connector insulator is formed from a resin material and has the slot 30SL that allows passage of the connection end of the optical module 10 at the time of attachment and detachment of the optical module 10. The slot 30SL has a maximum height of about 1.35 mm corresponding to a thickness of the connection end of the optical module 10. The slot 30SL is surrounded by side wall portions 30RS and 30LS, and an upper portion 30T that couples the side wall portions 30RS and 30LS to each other. The slot 30SL communicates with a connection end accommodating portion 30E into which the connection end of the optical module 10 is inserted. A minimum depth Dp of the connection end accommodating portion 30E is set to about 6.0 mm, for example. A portion forming an edge of the slot 30SL at the upper portion 30T of the connector insulator is provided with a predetermined first chamfer C1 as shown in FIG. 5. In addition, an end of the upper portion 30T of the connector insulator is also provided with a predetermined second chamfer C2.

A plurality of slits 30Asi and 30BSi (i=1 to n where n is a positive integer) are formed at given intervals along the Y-coordinate axis shown in FIG. 6 inside the slot 30SL.

The slits 30Asi are formed in an inner peripheral surface of the upper portion 30T and the slits 30Bsi are formed in an inner peripheral surface of a lower portion in such a way as to face the slits 30Asi.

Note that in FIG. 6, the Y-coordinate axis is in line with the direction of arrangement of the contact terminals 32ai and 36ai while the X-coordinate axis is in line with the direction of attachment and detachment of the connection end of the optical module 10. A Z-coordinate axis is orthogonal to the X-coordinate axis and the Y-coordinate axis.

The mutually adjacent slits 30Asi are partitioned by partition walls 30APi (i=1 to n where n is a positive integer) therebetween. The mutually adjacent slits 30Bsi are partitioned by partition walls 30BPi (i=1 to n where n is a positive integer) therebetween.

Figure 4:
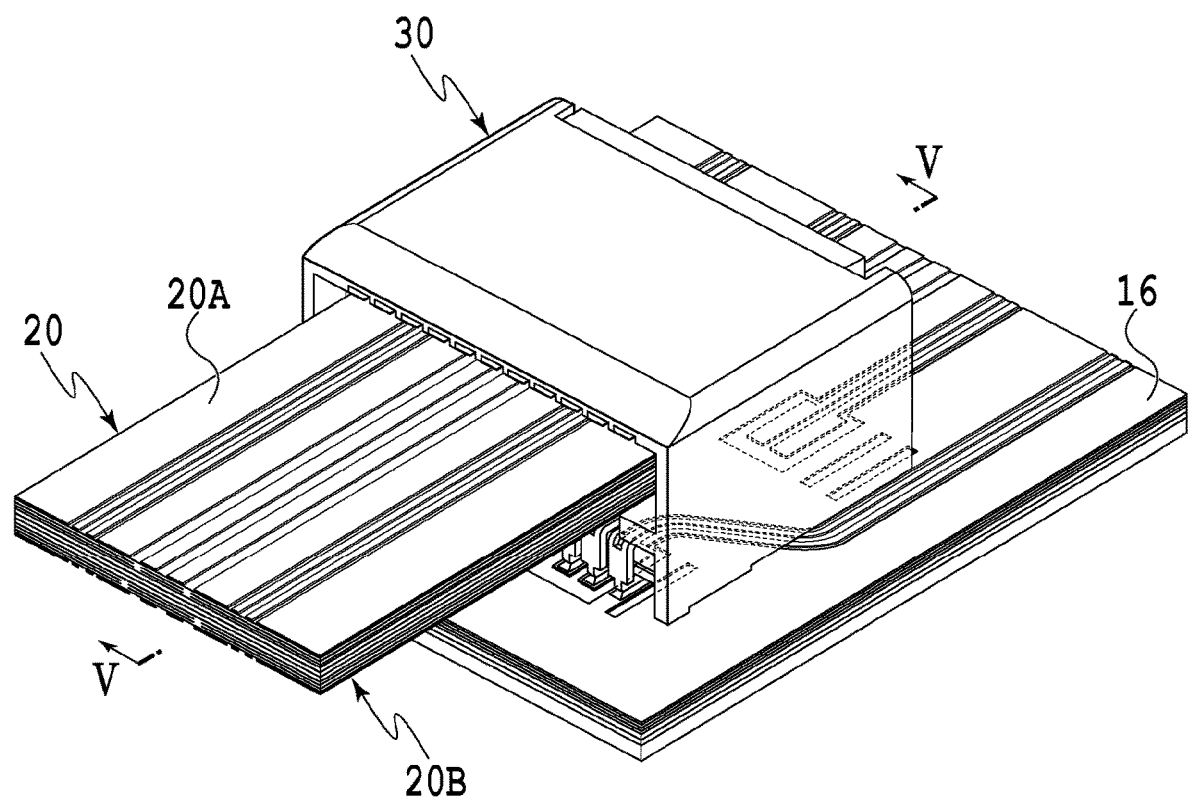
FIG. 4 is a perspective view showing a host connector and part of the wiring board used in the example of the receptacle assembly according to the present invention.

As shown in FIG. 5, the contact portions 36C of the movable contact portions 36M of the contact terminals 36a and the contact portions 32C of the movable contact portions 32M of the contact terminals 32ai are arranged opposite to one another inside the respective slits 30ASi and 30BSi. As shown in FIGS. 4 and 5, in a case where the connection end of the optical module 10 is inserted into the connection end accommodating portion through the slot 30SL, the connection end of the optical module 10 is inserted into a space between the contact portions 36C of the movable contact portions 36M of the contact terminals 36a and the contact portions 32C of the movable contact portions 32M of the contact terminals 32ai. At that time, the contact portions 36C of the movable contact portion 36M of the respective contact terminals 36a are brought into contact with the group of contact pads 20EA while the contact portions 32C of the movable contact portions 32M of the respective contact terminals 32ai are brought into contact with the group of contact pads 20EB. At that time, a maximum distance Lc from an opening end surface of the slot 30SL to the contact portions 36C of the movable contact portions 36M of the respective contact terminals 36a and to the contact portions 32C of the movable contact portions 32M of the respective contact terminals 32ai is set to about 3.0 mm at the maximum.

Between the coupling portions 32E of the contact terminals 32ai and the fixed terminal portions of the fixed portions 32F, connection members 34A, 34B, 34E, and 34F that connect between the mutually adjacent grounding contact terminals 32ai at electrically identical potential are fitted into a recess 30R of the connector insulator as shown in the enlarged view of FIGS. 5 and 7. The connection members 34A, 34B, 34E, and 34F are arranged in a line along the Y-coordinate axis in FIG. 5 in the recess 30R. The connection members 34A, 34B, 34E, and 34F are each formed from a conductive resin, for example, and have projections 34a, 34b, 34e, and 34f, respectively, that come into contact with surfaces of the coupling portions 32E from below the coupling portions 32E.

In addition, between the movable contact portions 36M of the contact terminals 36a and inner peripheral surfaces of the slits 30ASi of the connector insulator, connection members 38A, 38B, 38E, and 38F that connect between the mutually adjacent grounding contact terminals 36a at electrically identical potential are arranged parallel to one another along the Y-coordinate axis in FIG. 5 (see FIG. 7). The connection members 38A, 38B, 38E, and 38F integrally formed from a conductive resin, for example, have projections 38a, 38b, 38e, and 38f, respectively, which are arranged at given intervals and come into contact with surfaces of the movable contact portions 36M from above the movable contact portions 36M. A plurality of positioning pins 30D to be fitted into positioning holes in the printed wiring board 16 are formed at a bottom portion of the connector insulator.

Figure 8:
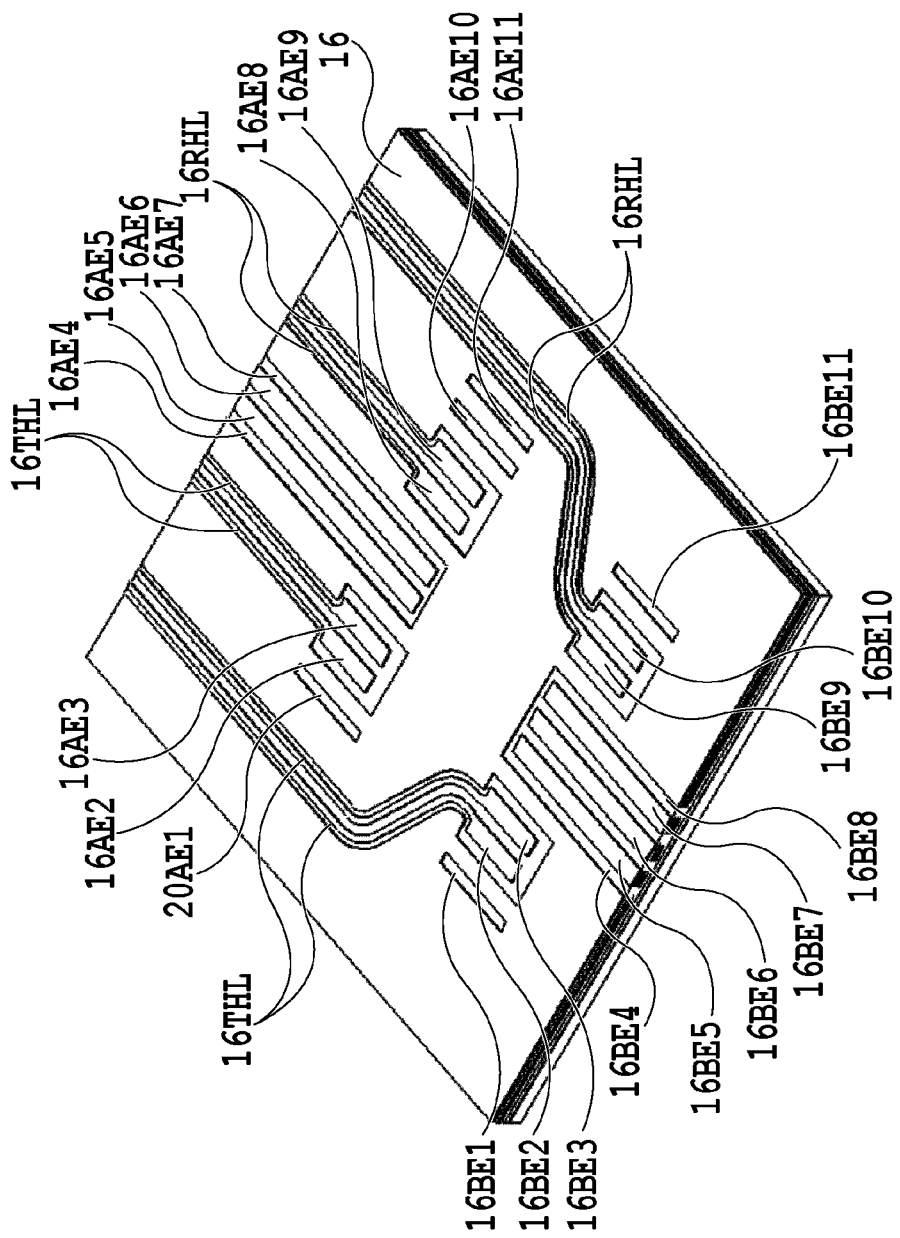
FIG. 8 is a diagram showing electrode portions and conductive patterns on the printed wiring board illustrated in FIG. 2.

The group of electrodes of the printed wiring board 16 to which the fixed terminal portions of the fixed portions 32F of the contact terminals 32ai and the fixed terminal portions of the fixed portions 36F of the contact terminals 36a are fixed by soldering, and the conductive patterns thereof are formed at an end of the printed wiring board 16 as partial illustrated in FIG. 8. The group of electrodes comprises a first group of electrodes formed of electrode portions 16BE1 to 16BE11 to which the fixed terminal portions of the fixed portions 32F of the contact terminals 32ai are fixed by soldering, and a second group of electrodes formed of electrode portions 16AE1 to 16AE11 to which the fixed terminal portions of the fixed portions 36F of the contact terminals 36a are fixed by soldering.

The first group of electrodes is formed at a position close to an endmost end of the printed wiring board 16 while the second group of electrodes is formed at a position more remote from the endmost end of the printed wiring board 16 than the position of the first group of electrodes is.

The electrode portions 16BE1 to 16BE11 in the first group of electrodes are formed to correspond to the contact pad 20B1 conducting to the ground line (G), the contact pads 20B2 and 20B3 conducting to the transmission-side high-speed signal lines (S), the contact pad 20B4 conducting to the ground line (G), the contact pads 20B5, 20B6, and 20B7 conducting to the low-speed control signal lines (S), the contact pad 20B8 conducting to the ground line (G), the contact pads 20B9 and 20B10 conducting to the receiving-side high-speed signal lines (S), and the contact pad 20B11 conducting to the ground line (G), respectively, which are formed on the lower surface 20B at the connection end of the board portion described above. The electrode portions 16BE2 and 16BE3 are connected directly to portions of conductive patterns serving as another high-speed signal lines (S), respectively, via conductive paths 16THL that are formed on a surface layer of the printed wiring board 16 and pass through locations away from one end of the second group of electrodes. In addition, the electrode portions 16BE9 and 16BE10 are connected directly to portions of conductive patterns serving as another high-speed signal lines (S), respectively, via conductive paths 16RHL that are formed on the surface layer of the printed wiring board 16 and pass through locations away from other end of the second group of electrodes.

The electrode portions 16AE1 to 16AE11 in the second group of electrodes are formed to correspond to the contact pad 20A1 conducting to the ground line (G), the contact pads 20A2 and 20A3 conducting to the transmission-side high-speed signal lines (S), the contact pad 20A4 conducting to the ground line (G), the power supply contact pads 20A5 and 20A6 conducting to the power supply line, the contact pad 20A7 conducting to the ground line (G), the contact pads 20A8 and 20A9 conducting to the receiving-side high-speed signal lines (S), the contact pad 20A10 conducting to the ground line (G), and the reserved contact pad 20A11, respectively, which are formed on the upper surface 20A at the connection end of the board portion described above.

The electrode portions 16AE2 and 16AE3 are connected directly to portions of conductive patterns serving as another high-speed signal lines (S), respectively, via conductive paths 16THL formed on the surface layer of the printed wiring board 16. In addition, the electrode portions 16AE8 and 16AE9 are connected directly to portions of conductive patterns serving as another high-speed signal lines (S), respectively, via conductive paths 16RHL formed on the surface layer of the printed wiring board 16.

Figure 9:
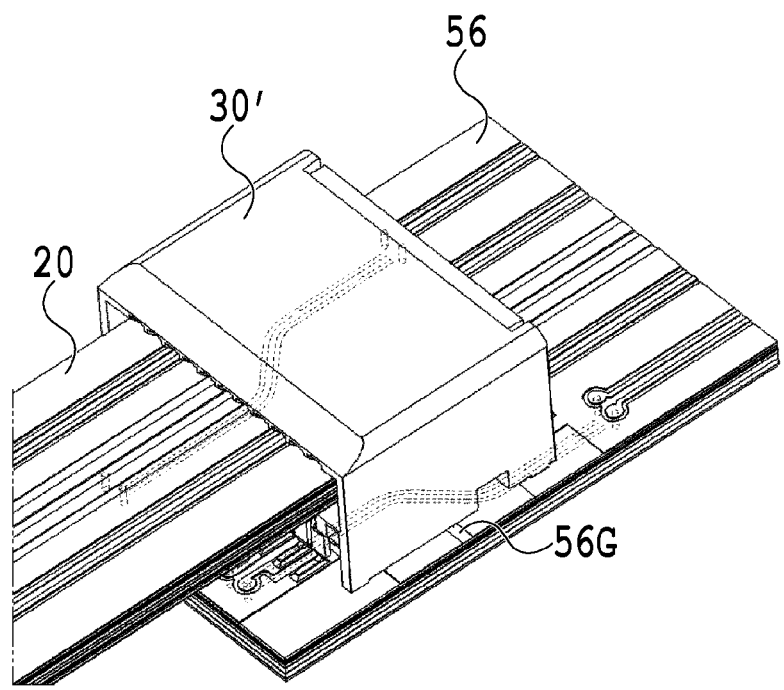
FIG. 9 is a perspective view showing a host connector and part of a wiring board used in another example of the receptacle assembly according to the present invention.

FIG. 9 shows a host connector and part of a wiring board used in another example of the receptacle assembly according to the present invention, together with the optical module board.

The optical module receptacle assembly is fixed onto a printed wiring board 56 in a given electronic device, for example. The optical module receptacle assembly comprises a receptacle cage (not shown) that forms a contour portion of the optical module receptacle assembly, and a host connector 30' placed in a host connector accommodating portion formed in the receptacle cage.

The host connector 30' comprises a connector insulator provided with a slot that allows passage of the connection end of the optical module board 20 in the case of attachment and detachment of the connection end of the optical module board 20, a plurality of first contact terminals (not shown) to be brought into contact with the lower surface 20B at the connection end, and a plurality of second contact terminals (not shown) to be brought into contact with the upper surface 20A at the connection end.

Because configurations of the connector insulator and the second contact terminals are the same as the configurations of the insulator and the contact terminals 36a shown in FIG. 6, explanations thereof will be omitted.

Each first contact terminal comprises a movable contact portion having the contact portion 32C provided at one end and brought into contact with one of the contact pads 20B1 to 20B11 of the connection end of the optical module 10, a fixed portion having a fixed terminal portion provided at one end and be fixed by soldering to a group of electrodes of the printed wiring board 56, and a coupling portion configured to couple another end of the movable contact portion to another end of the fixed portion. The fixed terminal portion of the fixed portion is bent toward a direction of pullout of the connection end of the optical module 10 in such a way as to be substantially parallel to the coupling portion.

The first contact terminals and the second contact terminals are configured to establish electrical connection of the connection end of the optical module board 20 to a group of electrodes to be connected to conductive patterns on the printed wiring board 56 to be described later.

Figure 10:
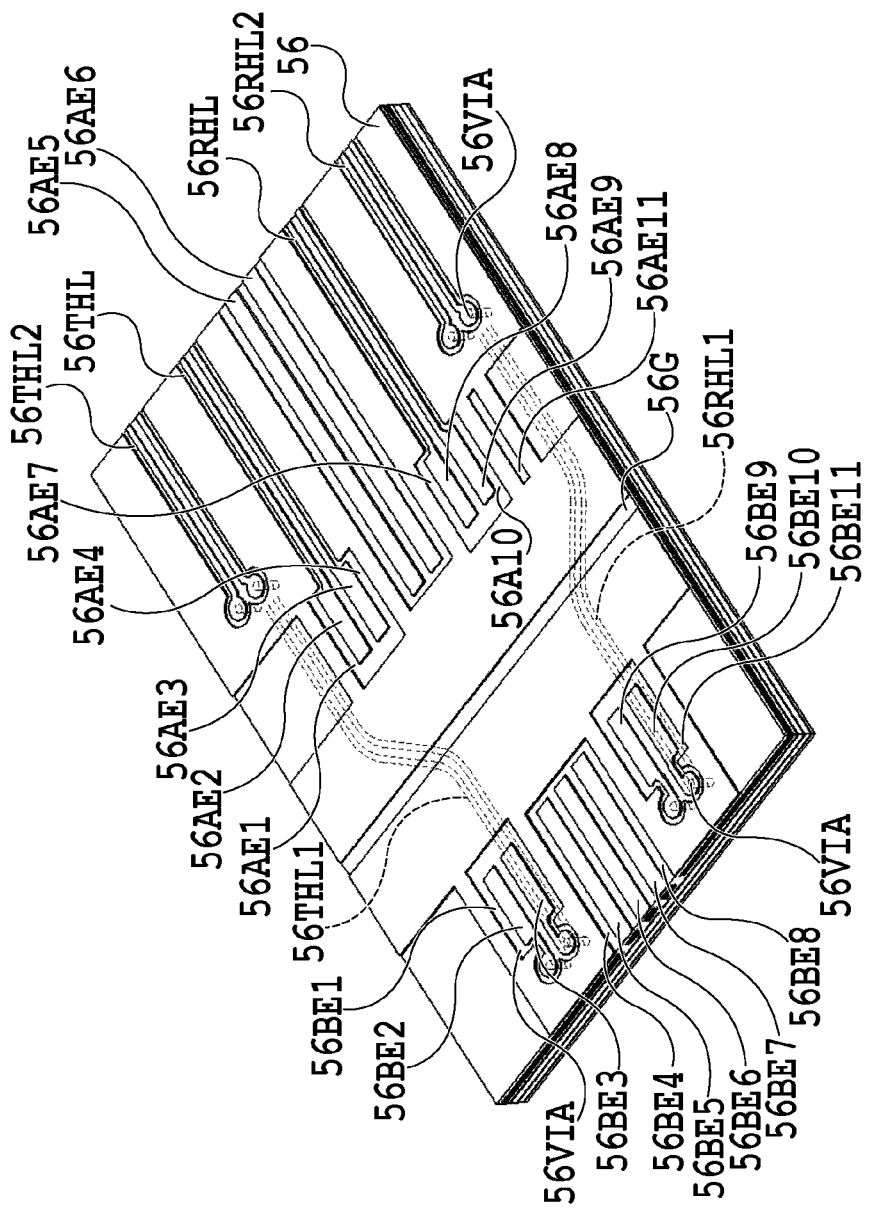
FIG. 10 is a diagram showing electrode portions and conductive patterns on the printed wiring board illustrated in FIG. 9.

The group of electrodes of the printed wiring board 56 to which the fixed terminal portions of the fixed portions of the plurality of first and second contact terminals are fixed by soldering, and the conductive patterns are formed at an end of the printed wiring board 56 as partial illustrated in FIG. 10.

The group of electrodes comprises a first group of electrodes formed of electrode portions 56BE1 to 56BE11 to which the fixed terminal portions of the fixed portions of the first contact terminals are fixed by soldering, and a second group of electrodes formed of electrode portions 56AE1 to 56AE11 to which the fixed terminal portions of the fixed portions of the second contact terminals are fixed by soldering. A grounding conductor 56G is formed between the first group of electrodes and the second group of electrodes on a mounting surface of the printed wiring board 56 in such a way as to partition between the first group of electrodes and the second group of electrodes. Thus, A crosstalk characteristic of the host connector 30' is further improved by forming the grounding conductor 56G to be connected to the grounding line through a via.

The above-described first group of electrodes is formed at a position close to an endmost end of the printed wiring board 56 while the above-described second group of electrodes is formed at a position more remote from the endmost end of the printed wiring board 56 than the position of the first group of electrodes is.

The electrode portions 56BE1 to 56BE11 in the first group of electrodes are formed to correspond to the contact pad 20B1 conducting to the ground line (G), the contact pads 20B2 and 20B3 conducting to the transmission-side high-speed signal lines (S), the contact pad 20B4 conducting to the ground line (G), the contact pads 20B5, 20B6, and 20B7 conducting to the low-speed control signal lines (S), the contact pad 20B8 conducting to the ground line (G), the contact pads 20B9 and 20B10 conducting to the receiving-side high-speed signal lines (S), and the contact pad 20B11 conducting to the ground line (G), respectively, which are formed on the lower surface 20B at the connection end of the board portion of the optical module board 20 described above.

The electrode portions 56BE2 and 56BE3 are connected to portions of respective conductive patterns 56THL2 serving as high-speed signal lines (S), respectively, through conductive paths 56THL1 and vias 56VIA. One end of each conductive path 56THL1 is connected to the electrode portions 56BE2 and 56BE3 through the corresponding via 56VIA located at a position adjacent to the electrode portions 56BE2 and 56BE3, and another end of each conductive path 56THL1 is connected to each corresponding conductive pattern 56THL2 through the corresponding via 56VIA located at a position adjacent to the conductive pattern 56THL2. As illustrated by dashed lines in FIG. 10, the respective conductive paths 56THL1 are formed on a lower layer located below the grounding conductor 56G that is formed on the surface layer of the printed wiring board 56.

The electrode portions 56BE9 and 56BE10 are connected to portions of conductive patterns 56RHL2 serving as high-speed signal lines (S), respectively, through conductive paths 56RHL1 and vias 56VIA. One end of each conductive path 56RHL1 is connected to the electrode portions 56BE9 and 56BE10 through the corresponding via 56VIA located at a position adjacent to the electrode portions 56BE9 and 56BE10, and another end of each conductive path 56RHL1 is connected to each corresponding conductive pattern 56THL2 through the corresponding via 56VIA located at a position adjacent to the conductive pattern 56RHL2. As illustrated by dashed lines in FIG. 10, the respective conductive paths 56RHL1 are formed on the lower layer located below the grounding conductor 56G that is formed on the surface layer of the printed wiring board 56.

The electrode portions 56AE1 to 56AE11 in the second group of electrodes are formed to correspond to the contact pad 20A1 conducting to the ground line (G), the contact pads 20A2 and 20A3 conducting to the transmission-side high-speed signal lines (S), the contact pad 20A4 conducting to the ground line (G), the power supply contact pads 20A5 and 20A6 conducting to the power supply line, the contact pad 20A7 conducting to the ground line (G), the contact pads 20A8 and 20A9 conducting to the receiving-side high-speed signal lines (S), the contact pad 20A10 conducting to the ground line (G), and the reserved contact pad 20A11, respectively, which are formed on the upper surface 20A at the connection end of the board portion described above.

The electrode portions 56AE2 and 56AE3 are connected directly to portions of conductive patterns serving as another high-speed signal lines (S), respectively, via each of conductive paths 56THL formed on the surface layer of the printed wiring board 56. In addition, the electrode portions 56AE8 and 56AE9 are connected directly to portions of conductive patterns serving as another high-speed signal lines (S), respectively, via each of conductive paths 56RHL formed on the surface layer of the printed wiring board 56.

As a consequence, the optical module board 20 used in the example of the transceiver module according to the present invention can increase the number of channels as compared to an optical module board 40 representing a reference example shown in FIGS. 11A and 11B to be described later. Moreover, because the structure of the printed wiring board 16 and the conductive patterns used in the example of the receptacle assembly according to the present invention shown in FIG. 8 are formed without using vias and the like while handling the arrangement of the group of contact pads on the optical module board 20, the structure and the conductive patterns are therefore simplified as compared to the conductive patterns on the printed wiring board 56 shown in FIG. 10.

Figure 11B:
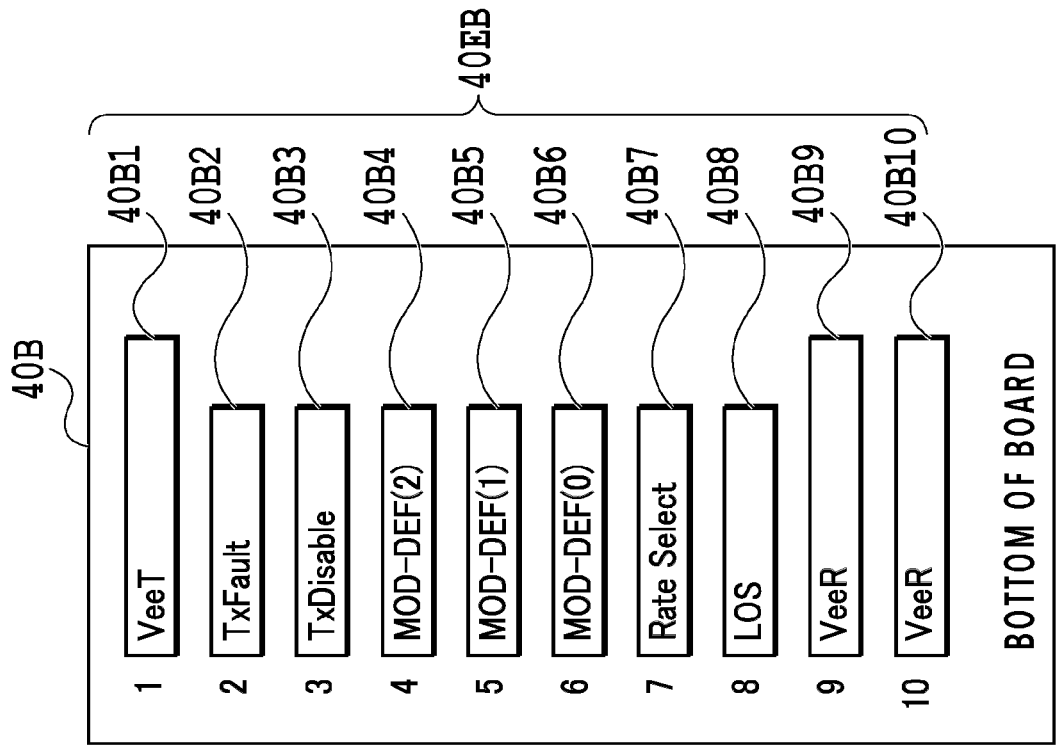
FIG. 11B is a diagram showing an arrangement of a group of contact pads at a connection end on a lower surface opposed to the connection end on the upper surface of the optical module board illustrated in FIG. 11A.
Figure 11A:
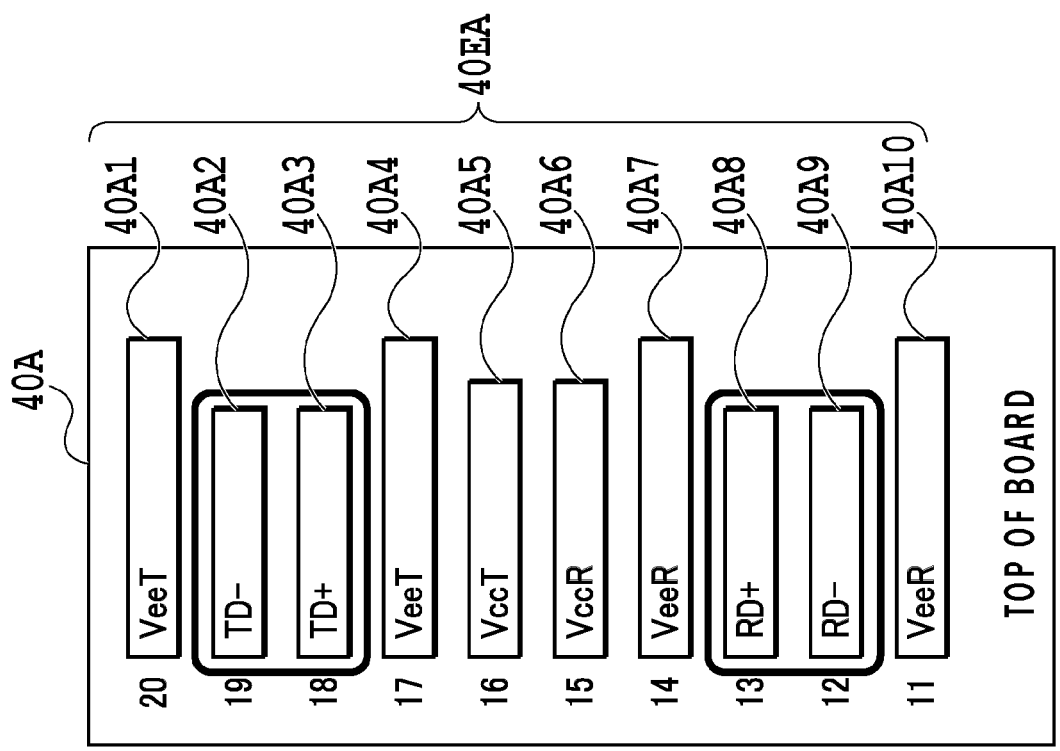
FIG. 11A is a diagram showing an arrangement of a group of contact pads at a connection end on an upper surface of an optical module board as a reference example.

FIGS. 11A and 11B schematically show the reference example of the optical module board 40 in the optical module, which is designed to be attachable to and detachable from the above-described host connectors 30 and 30'.

The optical module board 40 in the optical module comprises, as its main elements: a connector supporting member (not shown) configured to accommodate and support a receptacle (not shown) to which an optical connector is connected; and a board portion configured to support the connector supporting member and provided with a mounting surface to mount light-emitting/light-receiving element units and the like thereon.

As shown in the exaggeratedly enlarged view of FIGS. 11A and 11B, a connection end of the board portion has groups of contact pads 40EA and 40EB each including a plurality of contact pads formed parallel to one another at predetermined intervals, which are provided on an upper surface 40A and a lower surface 40B at one end of the connection end. In addition, the groups of contact pads 40EA and 40EB are electrically connected to conductive patterns in the board portion, respectively. A connection end of the board portion is electrically connected to an end portion which the above-described connector supporting member is provided through conductors formed inside.

As shown in FIG. 11A, for example, the group of contact pads 40EA formed on the upper surface 40A at the connection end of the board portion comprises, in order from the endmost end, a contact pad 40A1 conducting to a ground line (G), contact pads 40A2 and 40A3 conducting to transmission-side high-speed signal lines (S), a contact pad 40A4 conducting to the ground line (G), power supply contact pads 40A5 and 40A6 conducting to a power supply line, a contact pad 40A7 conducting to the ground line (G), contact pads 40A8 and 40A9 conducting to receiving-side high-speed signal lines (S), and a contact pad 40A10 conducting to the ground line (G). In other words, the group of contact pads 40EA comprises 10-piece contact pads.

As shown in FIG. 11B, for example, the group of contact pads 40EB formed on the lower surface 40B at the connection end of the board portion comprises, in order from the endmost end, a contact pad 40B1 conducting to the ground line (G), contact pads 40B2 and 40B3 conducting to low-speed control signal lines (S), contact pads 40B4, 40B5, and 40B6 conducting to the low-speed control signal lines (S), contact pads 40B7 and 40B8 conducting to the low-speed control signal lines (S), and contact pads 40B9 and 40B10 conducting to the ground line (G). In other words, the group of contact pads 40EB comprises 10-piece contact pads.

Accordingly, the contact pads 40B4, 40B5, and 40B6 on the optical module board 40 which are conducting to the low-speed control signal lines (S) correspond to the contact pads 20B5, 20B6, and 20B7 on the above-described optical module board 20 which are conducting to the low-speed control signal lines (S). Moreover, because the contact pads 40B4, 40B5, and 40B6 can be electrically connected to the electrode portions 16BE5, 16BE6, and 16BE7 through the contact terminals 32*ai*, the optical module board 40 having a less number of channels as compared to the optical module board 20 is also connectable to the above-described host connectors 30 and 30'.

Figure 12A:
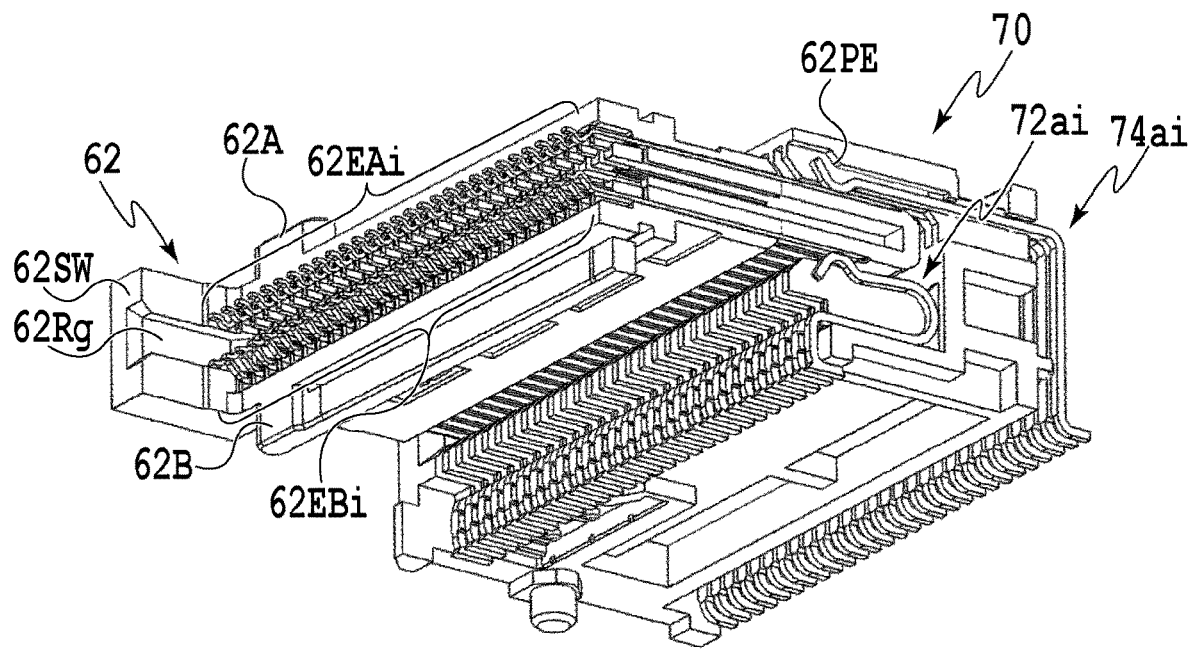
FIG. 12A is a perspective view including a partial cross-section of configurations of a plug connector used in another example of the transceiver module according to the present invention and of a host connector to which the plug connector is connected.

As shown in FIG. 3, the connection end of the board portion of the optical module board 20 used in the example of the transceiver module assembly according to the present invention described above has the configuration including the groups of contact pads 20EA and 20EB each forming of the plurality of contact pads formed parallel to one another at predetermined intervals and provided on the upper surface 20A and the lower surface 20B at one end (see FIG. 5). However, the present invention is not limited only to this example. For instance, as shown in FIG. 12A, a connection end of a module board 60 may be configured to be connected to a plug connector 62.

Figure 12B:
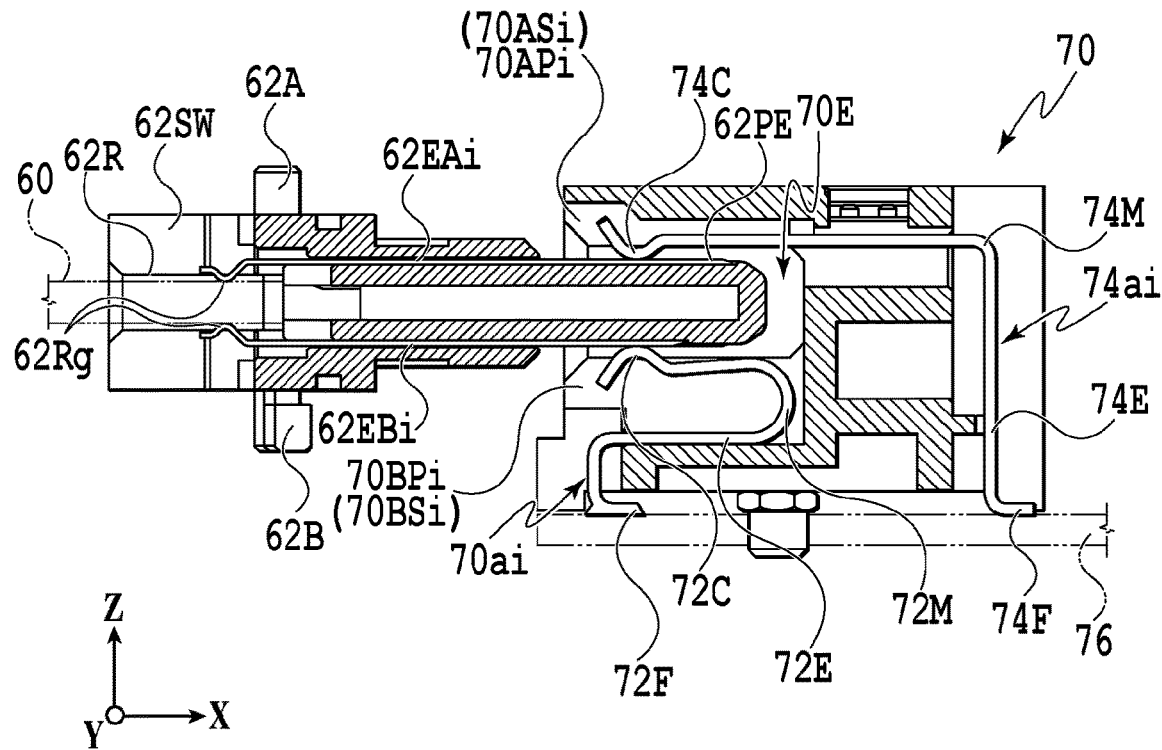
FIG. 12B is a cross-sectional view showing the configurations of the example illustrated in FIG. 12A together with a printed wiring board.

In FIG. 12B, an end of the module board 60 to be inserted into the plug connector 62 has electrode portions formed of a plurality of contact pads 60Ei (i=1 to n where n is a positive integer) formed opposite to one another on a top surface and the back. The contact pads 60Ei are arranged in a line at predetermined intervals in a direction substantially orthogonal to a direction of insertion of the module board 60 into the plug connector 62. Arrangements of the contact pads 60Ei on the top surface and the back may be the same as the arrangements of the group of contact pads 20EA and the group of contact pads 20EB described above as shown in FIGS. 1A and 1B. Alternatively, the arrangement of the contact pads 60Ei on the back, for instance, may comprise at least a pair of contact pads conducting to the transmission-side high-speed signal lines (S) and a pair of contact pads conducting to the receiving-side high-speed signal lines (S).

As shown in FIG. 12B, the plug connector 62 comprises a connection end 62PE, a board supporting portion which is continuous with the connection end 62PE and configured to support the above-described end of the module board 60, and a plurality of contact terminals 62EAi and 62EBi (i=1 to n where n is a positive integer) supported by the connection end 16PE and the board supporting portion, the plug connector being integrally formed from a resin material, for example.

The connection end 62PE is inserted into a slot of a host connector 70 to be described later. The connection end 62PE has a recess 62R located inside thereof into which the end of the module board 60 is inserted. The recess 62R communicates with an opening end portion of the board supporting portion. Moreover, both side portions of the recess 62R are formed from side wall portions. In addition, grooves 62Rg that guide side portions of the module board 60 are formed at the both side wall portions that form the recess 62R so as to retain a posture of the module board 60 parallel to an upper surface of the connection end 62PE.

The board supporting portion of the plug connector 62 has the opening end portion that allows passage of the inserted end of the module board 60. A pair of positioning portions 16A to be brought into contact with board supporting walls (not shown) in the upper case and the lower case of the optical module are formed away from each other on an upper surface of the board supporting portion. In addition, an elongate spring portion 62B to be brought into contact with the board supporting walls (not shown) in the upper case and the lower case is formed on a lower surface of the board supporting portion.

The contact terminals 62EAi are arranged on the upper surface of the connection end 62PE opposed to the pair of positioning portions 62A of the board supporting portion and at predetermined intervals corresponding to the above-described contact pads 60Ei. The contact terminals 62EAi comprise power supply terminals, signal contact terminals, and grounding contact terminals, for example. A pair of the adjacent signal contact terminals are provided between the grounding contact terminals, for example. The contact terminals 62EAi have fixed terminal portions to be fixed by soldering to the contact pads 60Ei, and contact portions to be brought into contact with contact portions of contact terminals 74ai of the host connector 70.

The contact terminals 62EBi are arranged on the lower surface of the connection end 62PE opposed to the spring portion 62B of the board supporting portion and at predetermined intervals corresponding to the above-described contact pads 60Ei. The contact terminals 62EBi comprise power supply terminals, signal contact terminals, and grounding contact terminals, for example. A pair of the adjacent signal contact terminals are provided between the grounding contact terminals, for example. The contact terminals 62EBi have fixed terminal portions to be fixed by soldering to the contact pads 60Ei, and contact portions to be brought into contact with contact portions of contact terminals 72ai of the host connector 70.

The host connector 70 is made adaptable to a communication speed of 56 Gbs or above, for example, and comprises a connector insulator provided with a slot that allows attachable and detachable insertion of the connection end 62PE of the plug connector 62 described above, and the plurality of contact terminals 72ai and 74ai (i=1 to n where n is a positive integer).

The contact terminals 72ai and 74ai are configured to establish electrical connection of the connection end 62PE of the plug connector 62 to a group of electrodes to be connected to conductive patterns of a printed wiring board 76 to be described later.

As shown in FIG. 12B, each contact terminal 72ai comprises a movable contact portion 72M having a contact portion 72C provided at one end and brought into contact with one of the contact terminals 62EBi of the connection end 62PE of the plug connector 62, a fixed portion 72F having a fixed terminal portion provided at one end and fixed by soldering to the group of electrodes of the printed wiring board 76, and a coupling portion 72E configured to couple another end of the movable contact portion 72M to another end of the fixed portion 72F. The fixed terminal portion of the fixed portion 72F is bent toward a direction of insertion of the connection end 62PE of the plug connector 62 along the X-coordinate axis direction in such a way as to be substantially parallel to the coupling portion 72E.

Note that in FIG. 12B, A Y-coordinate axis is in line with a direction of arrangement of the contact terminals 72ai and 74ai while the X-coordinate axis is in line with a direction of attachment and detachment of the connection end 62PE of the plug connector 62. A Z-coordinate axis is orthogonal to the X-coordinate axis and the Y-coordinate axis.

Each contact terminal 74ai comprises a movable contact portion 74M having a contact portion 74C provided at one end and brought into contact with one of the contact terminals 62EAi of the connection end 62PE of the plug connector 62, a fixed portion 74F having a fixed terminal portion provided at one end and fixed by soldering to the group of electrodes of the printed wiring board 76, and a coupling portion 74E configured to couple another end of the movable contact portion 74M to another end of the fixed portion 74F. The fixed terminal portion of the fixed portion 74F is bent toward the direction of insertion of the connection end 62PE of the plug connector 62 in such a way as to be substantially orthogonal to the coupling portion 74E. The movable contact portion 74M extends substantially parallel to a mounting surface of the printed wiring board 76 while the coupling portion 74E is formed to be bent from an end of the movable contact portion 74M in such a way as to be substantially perpendicular to the mounting surface of the printed wiring board 76.

The connector insulator is formed from a resin material and has the slot that allows passage of the connection end 62PE of the plug connector 62 at the time of attachment and detachment of the optical module. The slot has a maximum height corresponding to a thickness of the connection end 62PE of the plug connector 62. The slot is surrounded by side wall portions, and an upper portion that couples the both side wall portions to each other. The slot communicates with a connection end accommodating portion 70E into which the connection end 62PE of the plug connector 62 is inserted. Provided around the slot are a plurality of slits 70ASi and 70BSi (i=1 to n where n is a positive integer) which are formed at given intervals along the Y-coordinate axis shown in FIG. 12B. The slits 70ASi are formed in an inner peripheral surface of the upper portion and the slits 70BSi are formed in an inner peripheral surface of a lower portion in such a way as to face the slits 70ASi.

The mutually adjacent slits 70ASi are partitioned therebetween by partition walls 70APi (i=1 to n where n is a positive integer). The mutually adjacent slits 70BSi are partitioned therebetween by partition walls 70BPi (i=1 to n where n is a positive integer).

The contact portions 72C of the movable contact portions 72M of the contact terminals 72*ai* and the contact portions 74C of the movable contact portions 74M of the contact terminals 74*ai* are arranged opposite to one another inside the slits 70ASi and 70BSi. As shown in FIG. 12B, in a case where the connection end 62PE of the plug connector 62 is inserted into the connection end accommodating portion 70E through the slot, the connection end 62PE of the plug connector 62 is inserted into a space between the contact portions 72C of the movable contact portions 72M of the contact terminals 72*ai* and the contact portions 74C of the movable contact portions 74M of the contact terminals 74*ai*. At that time, the contact portions 72C of the movable contact portion 72M of the respective contact terminals 72*ai* are brought into contact with the contact terminals 62EBi while the contact portions 74C of the movable contact portions 74M of the respective contact terminals 74*ai* are brought into contact with the contact terminals 62EAi.

Although illustration is omitted, regarding the examples of the group of electrodes of the printed wiring board 76 to which the fixed terminal portions of the fixed portions 72F of the contact terminals 72*ai* and the fixed terminal portions of the fixed portions 74F of the contact terminals 74*ai* are fixed by soldering, and of the conductive patterns, a pair of contact pads conducting to the transmission-side high-speed signal lines (S) that are electrically connected to the fixed terminal portions of the fixed portions 72F of the contact terminals 72*ai* and a pair of contact pads conducting to the receiving-side high-speed signal lines (S) are connected directly to portions of the conductive patterns serving as another high-speed signal lines (S), respectively, via conductive paths as with the example shown in FIG. 8, for instance. Accordingly, in this example as well, the group of electrodes of the printed wiring board 76 and the conductive patterns can be formed without using vias and the like.

Note that in the above-described examples of the transceiver module assembly and the receptacle assembly according to the present invention, a heatsink (not shown) may be provided at the receptacle cage 15 so as to dissipate heat generated from the optical module 10 through the heatsink.

The invention claimed is:

1. A high-speed signal connector, the connector comprising:
 a housing including a connection end accommodating portion provided with a first group of contact terminals connected to a lower electrode surface at a connection end of an optical module board and a second group of contact terminals connected to an upper electrode surface facing opposite to the lower electrode surface at the connection end of the optical module board, wherein
 one of the first group of contact terminals or the second group of contact terminals includes:
  an array of a plurality of contact terminals electrically connected to a group of low-speed control signal lines,
  a first pair of contact terminals electrically connected to a first pair of transmission-side high-speed signal lines, positioned adjacent to each other, positioned on a first side of the array of the plurality of contact terminals, and surrounded by grounding contact terminals, and
  a second pair of contact terminals electrically connected to a first pair of receiving-side high-speed signal lines, positioned adjacent to each other, positioned on a second side of the array of the plurality of contact terminals opposite to the first side, and surrounded by grounding contact terminals, and
 the other of the first group of contact terminals or the second group of contact terminals includes:
  a pair of power supply contact terminals electrically connected to a pair of power supply lines,
  a third pair of contact terminals electrically connected to a second pair of transmission-side high-speed signal lines,
  a first grounding contact terminal interposing between the pair of power supply contact terminals and the third pair of contact terminals,
  a fourth pair of contact terminals electrically connected to a second pair of receiving-side high-speed signal lines, and
  a second grounding contact terminal, and
 the first group of contact terminals is offset with respect to the second group of contact terminals along a direction of arrangement of the first group of contact terminals,
 a distance from an innermost end with respect to the housing of a movable contact portion of each of the contact terminals constituting the first group of contact terminals to a mounting surface of a wiring board to which the housing is fixed is greater than a distance from an uppermost end with respect to the housing of an inclined surface portion of a fixed portion of each of the contact terminals constituting the second group of contact terminals to the mounting surface, the innermost end being located at a U-shaped curved portion of the movable contact portion, the inclined surface portion being inclined downward and inward with respect to the housing.

2. The high-speed signal connector according to claim 1, wherein the grounding contact terminals constituting part of the first group of contact terminals are connected therebetween by a plurality of connection members at electrically identical potential.

3. The high-speed signal connector according to claim 1, wherein the first group of contact terminals and the second group of contact terminals comprise 11-piece contact terminals respectively.

4. The high-speed signal connector according to claim 1, wherein when fixed terminal portions of the contact terminals constituting the first group of contact terminals are formed by being folded in an insertion direction of the connection end of the optical module board with respect to the connection end accommodating portion of the housing, the fixed terminal portions of at least one of the pairs of contact terminals are connected directly to an end of a conductive path for high-speed signals formed so as to be adjacent to a conductive path to which the second group of contact terminals is electrically connected on a wiring board to which the housing is fixed.

5. A receptacle assembly comprising:
 the high-speed signal connector according to claim 1, the connector being connected to a transceiver module including the optical module board; and
 a receptacle cage including: a module accommodating portion having a module slot provided at one end and configured to allow passage of the transceiver module, the module accommodating portion for attachably and detachably accommodating the transceiver module; and a connector accommodating portion communicating with the module accommodating portion and accommodating the high-speed signal connector.

6. The high-speed signal connector according to claim 4, wherein the end of the optical module board is connected to a plug connector.

7. The high-speed signal connector according to claim 1, wherein
each of the contact terminals constituting the first group of contact terminals and the second group of contact terminals includes a coupling portion configured to couple the movable contact portion to the fixed portion, and
the innermost end of the movable contact portion of each of the contact terminals constituting the first group of contact terminals is an end of each of the contact terminals constituting the first group of contact terminals that is closest to the coupling portion of each of the contact terminals constituting the second group of contact terminals in a direction parallel to the mounting surface of the wiring board.

8. A transceiver module assembly comprising:
a transceiver module including an optical module board which has:
on one electrode surface, a first group of contact pads, each contact pad of the first group of contact pads being electrically connected to a respective signal line among a first group of signal lines, the first group of signal lines including:
a pair of transmission-side high-speed signal lines adjacent to each other and surrounded by a first grounding line,
a pair of receiving-side high-speed signal lines adjacent to each other and surrounded by a second grounding line, and
a group of low-speed control signal lines positioned between the pair of transmission-side high-speed signal lines and the pair of receiving-side high-speed signal lines;
on the other electrode surface facing opposite to the one electrode surface, a second group of contact pads offset with respect to the first group of contact pads along a direction of arrangement of the first group of contact pads, each contact pad of the second group of contact pads being connected to a respective signal line among a second group of signal lines, the second group of signal lines including:
a pair of power supply lines,
a second pair of transmission-side high-speed signal lines,
a third grounding line interposing between the pair of power supply lines and the second pair of transmission-side high-speed signal lines,
a second pair of receiving-side high-speed signal lines, and
a fourth grounding line; and
a receptacle assembly including: a high-speed signal connector connected to the transceiver module; and a receptacle cage having a module accommodating portion including a module slot provided at one end and configured to allow passage of the transceiver module, the module accommodating portion for attachably and detachably accommodating the transceiver module, and a connector accommodating portion communicating with the module accommodating portion and accommodating the high-speed signal connector, wherein
the high-speed signal connector comprises a housing including a connection end accommodating portion provided with a first group of contact terminals connected to a lower electrode surface at a connection end of the optical module board and a second group of contact terminals connected to an upper electrode surface at the connection end of the optical module board, and
a distance from an innermost end with respect to the housing of a movable contact portion of each of the contact terminals constituting the first group of contact terminals to a mounting surface of a wiring board to which the housing is fixed is greater than a distance from an uppermost end with respect to the housing of an inclined surface portion of a fixed portion of each of the contact terminals constituting the second group of contact terminals to the mounting surface, the innermost end being located at a U-shaped curved portion of the movable contact portion, the inclined surface portion being inclined downward and inward with respect to the housing.

9. The transceiver module assembly according to claim 8, wherein
each of the contact terminals constituting the first group of contact terminals and the second group of contact terminals includes a coupling portion configured to couple the movable contact portion to the fixed portion, and
the innermost end of the movable contact portion of each of the contact terminals constituting the first group of contact terminals is an end of each of the contact terminals constituting the first group of contact terminals that is closest to the coupling portion of each of the contact terminals constituting the second group of contact terminals in a direction parallel to the mounting surface of the wiring board.

\* \* \* \* \*